Figure 1:
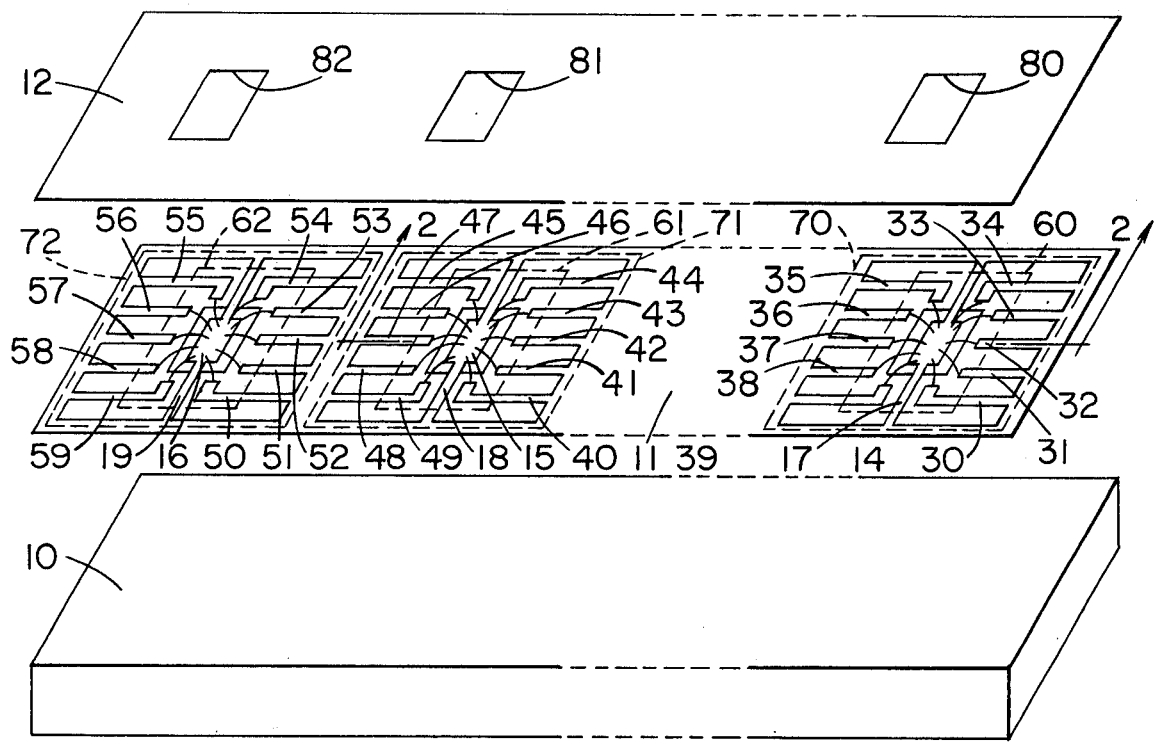

United States Patent [19]

Koo et al.

[11] 4,041,896
[45] Aug. 16, 1977

[54] MICROELECTRONIC CIRCUIT COATING SYSTEM

[75] Inventors: Tuh-Kai Koo, Dayton; Armand J. van Velthoven, West Carrollton, both of Ohio

[73] Assignee: NCR Corporation, Dayton, Ohio

[21] Appl. No.: 576,517

[22] Filed: May 12, 1975

[51] Int. Cl.² ............................................. C23C 13/02
[52] U.S. Cl. .................................. 118/48; 118/49.1; 118/504; 427/99
[58] Field of Search ............................. 118/48–49.5, 118/504; 427/259, 294, 99; 174/52 R, 52 S; 357/54, 73

[56] References Cited

U.S. PATENT DOCUMENTS

| | | | |
|---|---|---|---|
| 2,704,992 | 3/1955 | Schell | 118/49 |
| 2,879,188 | 3/1959 | Strull | 118/490 X |
| 3,117,025 | 1/1964 | Learn et al. | 118/49 |
| 3,207,126 | 9/1965 | Byron | 118/49 |
| 3,276,423 | 10/1966 | Triller | 118/504 |
| 3,312,572 | 4/1967 | Norton et al. | 118/490 X |
| 3,330,694 | 7/1967 | Black et al. | 357/73 |
| 3,465,209 | 9/1969 | Denning et al. | 357/54 |
| 3,597,834 | 8/1971 | Lathrop et al. | 427/259 |
| 3,621,812 | 11/1971 | Hissong, Jr. et al. | 118/48 |
| 3,647,533 | 3/1972 | Hicks | 427/99 |
| 3,678,892 | 7/1972 | Fairchild | 118/504 |
| 3,785,046 | 1/1974 | Jennings | 118/504 |

Primary Examiner—Mervin Stein
Attorney, Agent, or Firm—J. T. Cavender

[57] ABSTRACT

A coating system applies silicon dioxide to microelectronic dies mounted on electrical conductor systems such as lead frames, circuit boards and to connecting wires in a single operation while preventing the deposition of silicon dioxide on the outer portions of leads which are formed as part of its lead frame.

20 Claims, 2 Drawing Figures

U.S. Patent  Aug. 16, 1977  4,041,896

MICROELECTRONIC CIRCUIT COATING SYSTEM

The present invention refers to coating systems and more particularly to a coating system for depositing silicon dioxide on only selected areas of electrical conductor systems such as lead frames and circuit boards, the integrated circuit die mounted thereon, and the connecting bonding wires.

Our co-pending application Ser. No. 572,576, filed Apr. 28, 1975, discloses a microelectronic structure comprising a lead frame, a die mounted on the lead frame, bonding wires connecting bonding pads on the die to leads on the lead frame and a sheath of silicon dioxide covering the die, the bonding wires and a portion of the leads at their bonding wire junction ends, but the remainder of the leads are devoid of any silicon dioxide coating. In the past coating systems have been utilized to coat die and complete lead frames. The present invention provides a coating system which deposits silicon dioxide on dies, connecting bonding wires and only a limited area of an electrical conductor system such as a lead frame or circuit board defined by the geometry of the die and bonding wires.

It is, therefore, an object of the invention to provide a new and improved microelectronic circuit coating system.

Another object is to provide a microelectronic circuit coating system that coats a first predetermined area of an electrical conductor system with circuit elements mounted thereon with silicon dioxide while preventing deposition on a second predetermined area.

An additional object is to provide a microelectronic circuit coating system that deposits silicon dioxide on die and connecting bonding wires mounted on an electrical conductor system and prevents silicon deposition on sections of the leads in the electrical conductor system.

Figure 2:
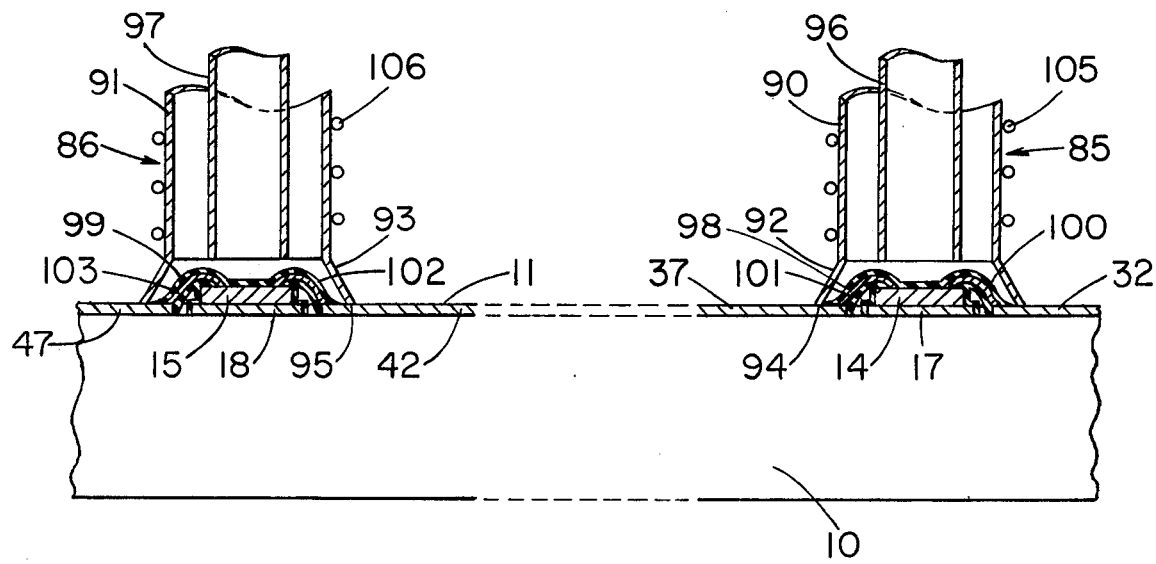

Further objects and advantages will become apparent from the following description of the drawings in which:

FIG. 1 is an exploded view of an embodiment of the invention and a lead frame assembly to be coated; and FIG. 2 is a modification of the embodiment of the invention illustrated in FIG. 1.

While this invention is susceptible of embodiments in many different forms, there is shown in the drawings and will herein be described in detail, embodiments of the invention with the understanding that the present disclosures are to be considered as exemplifications of the principles of the invention and are not intended to limit the invention to the embodiments illustrated. The scope of the invention will be pointed out in the appended claims.

Referring to FIG. 1, a plate 10 has a conventional heating device of any type well known to those skilled in the art. A lead frame 11 is supported on the plate 10 and by heating devices (not shown) raises the temperature of the lead frame 11 to at least 350° C. During deposition of silicon dioxide a mask 12 is placed over the lead frame 11.

A series of die supporting sections 17, 18 and 19 are stamped out of the lead frame 11. Each is joined to the opposite outer edges of the lead frame 11. Microelectronic circuit die 14, 15 and 16 are secured on the respective frame sections 17, 18, and 19. Surrounding die 14 is a series of symmetrically positioned electrical leads 30–39. The die 14 has a series of 10 boiling pads. A fine wire connects each of the 10 bonding pads to one of the inner ends of the respective leads 30–39. These wires are bonded between the respective bonding pads and the inner lead ends by any type of bonding well known to those skilled in the art. The junctions formed between the wires and the inner lead ends define a first predetermined area as indicated by the dash line 60. In accordance with the invention more fully described in our co-pending application Ser. No. 572,576, silicon dioxide must be deposited on the die 14 and its connecting bonding wires in order to form a sheath over the junctions of the wires and the bonding pads and over the remainder of the die.

Further, in accordance with the invention more fully described in our co-pending application Ser. No. 572,576, the portion of the leads 30–39 extending outwardly beyond the area enclosed by the dash line 60 must be devoid of silicon dioxide because electrical connections would be impaired. Therefore, a second predetermined area enclosed between the dash line 60 and a dash line 70 must be kept free of silicon dioxide.

In like manner, a series of 10 leads are symmetrically positioned around the die 15 and a series of 10 leads 50–59 are positioned around the die 16. Dies 15 and 16 are identical to die 14 and have 10 connecting bonding wires bonded between the 10 respective bonding pads and the 10 inner ends of leads 40–49 and 50–59. Again, the electric junction and the wires of the inner ends of the leads define predetermined areas which are to be coated with silicon dioxide. These areas are enclosed within the dash lines 61 and 62 respectively. The areas which must be kept free from silicon dioxide deposition are enclosed between the dash lines 61 and 71 and between the dash lines 62 and 72 respectively.

The areas of the lead frame 11 outside the dash lines 70, 71 and 72, are cut away to disconnect the leads 30–59 from each other by a later step in the manufacturing process of the microelectronic circuits. Therefore, these areas outside dash lines 70–72 may either be coated or not coated with silicon dioxide. The mask 12 has a series of apertures 80–82. Aperture 80 corresponds to the area within the line 60 defined by the bonding wires extending from die 14 to the leads 30–39. The aperture 81 corresponds to the area within the dash line 61 defined by the wires from die 15 extending to the inner ends of the leads 40–49, and aperture 82 corresponds to the area within the dash line 62 corresponding to the bonding wires extending from die 19 to the inner ends of leads 50–59.

If only one die is manufactured at a time, such as die 14, the first predetermined area, which is the area to receive silicon dioxide, is enclosed by dash line 60 and the second predetermined area, which is to be free of silicon dioxide, is defined between the dash lines 60 and 70. If a multiplicity of microelectronic circuits are to be manufactured from a single lead frame, as indicated in FIG. 1, the first predetermined area which is the area to receive silicon dioxide is composed of three segments within the dash lines 60, 61 and 62. Then the second predetermined area, which is to be free of silicon dioxide, is defined between the dash lines 60–70, 61–71 and 62–72 respectively. To accomplish the silicon dioxide deposition, the lead frame 11 is placed upon and supported by the plate 10. The mask 12 is then placed over the lead frame 11 so that the apertures 80–82 are aligned with the three segments of the first predetermined area as indicated within the respective dash lines 60–62. The heating means raises the temperature of the plate 10, lead frame 11 and mask 12 to at least 350° C. A mixture of oxygen, silane and a carrier gas such as nitrogen is applied to the top of the mask 12. By this procedure of chemical-vapor deposition, a layer of approximately 1 μm of silicon dioxide is applied over the die 14–16, their respective connecting wires and the junctions of the wires and leads 30–59. The mask 12 is then removed from the lead frame 11. The die, bonding wires and the inner ends of the leads 30–59 are placed within a protective plastic shield by one of the constructions described in detail in our co-pending application Ser. No. 572,576.

Referring now to FIG. 2, a second embodiment of the invention is illustrated. The plate 10 supports the lead frame 11 as in the embodiment of the invention illustrated in FIG. 1. A die 14 and a die 15 are secured to the lead frame 11. The lead frame 11 is positioned on and supported by the plate 10 as before. A gas feed and exhaust head, generally indicated at 85, is positioned over die 14 and a gas feed and exhaust head, generally indicated at 86, is positioned over the die 15. The head 85 is composed of an outer tube 90 having an extending end section 92 which forms an aperture 94 which corresponds to the segment of the first predetermined area enclosed within the dash line 60 and an inner tube 96 spaced from the outer tube 90 to form a passage therebetween. Similarly, the concentric gas feed and exhaust head 86 is composed of an outer tube 91 which has an extending end section 93 that forms an aperture 95 which corresponds to the segment of the first predetermined area defined between extending bonding wires of the die 15 which is the area enclosed by the dash line 61 and an inner tube 97 spaced from the outer tube 91 to form a passage therebetween.

The heads 85 and 86, and as many similar heads as is required for coating a given lead frame, may be secured in any type of moveable mount well known to those skilled in the art for simultaneously positioning the heads over the respective segments of the first predetermined areas which is the area to be coated with silicon dioxide.

Lead wire 100 is bonded to a bonding pad on die 17 and to the lead 32 and a lead wire 101 is bonded to a bonding pad on die 17 and to the lead 37. Similarly, lead wires 102 and 103 are ultrasonically bonded to bonding pads on the die 18 and to the leads 42 and 47 respectively.

After the lead frame 11 is positioned on the plate 10 and the respective heads 85 and 86 are positioned as illustrated in FIG. 2 over the respective dies 17 and 18, the entire assembly is heated to at least 350° C, then a mixture of oxygen, silane, and a carrier gas such as nitrogen is forced through the inner tubes 96 and 97 down onto the first predetermined area. Layers of silicon dioxide 98 and 99 are thus deposited over the die 17 and 18, the connecting wires extending from these die and the junctions of these wires with the ends of the leads 100–103 respectively. As before, a suitable thickness of silicon dioxide of about 1 μm has been found desirable. Exhaust gases and by-products from the chemical deposition of silicon dioxide are carried upward through the passages between outer tube 90 and inner tube 96 and through the passages between the outer tube 91 and the inner tube 97.

The sections 92 and 93 prevent silicon dioxide from forming on the outwardly extending portions of leads 32, 37, 42 and 47 which are in the second predetermined area that is to be free of silicon dioxide. A cooling coil 105 surrounds the outer tube 90 and a cooling coil 106 surrounds the outer tube 91 to cool the exhaust gases being removed from the first predetermined area.

While in the preferred embodiment described, the deposition of silicon dioxide by chemical vapor deposition utilizing a mixture of oxygen, silane and nitrogen as a carrier was specified, those skilled in the art will recognize that other mixtures for the chemical deposition of silicon dioxide may be utilized and further that the construction described herein can be utilized for the chemical deposit of other materials. In addition, elevated temperatures less than 350° C might be utilized with various chemically deposited materials. The preferred temperature in each case being dependent upon the materials utilized.

While the coating of dies and bonding wires on a lead frame have been described, the apparatus disclosed herein may be utilized to deposit material on the dies and bonding wires which are mounted onto the electrical conductor systems such as circuit boards. The term "circuit boards" as used herein refers to any substrate which has electrical conductors in the form of runs or leads printed or otherwise deposited onto the surfaces of the substrate. It, therefore, includes circuit boards having silicon dioxide substrates with metallized leads deposited thereon. All such variations and modifications are intended to be within the scope of the appended claims.

We claim:

1. A microelectronic circuit coating system for depositing silicon dioxide on a die secured to an electrical conductor system with bonding wires connecting bonding pads on the die to leads on the electrical conductor system, comprising:

means for supporting an electrical conductor system having a die with wires extending from said die to leads on the electrical conductor system, said die and extending wires defining a first predetermined area, means for directing a chemical deposition mixture onto said die and electrical conductor system, means for heating said supporting means and electrical conductor system to an elevated temperature, and masking means positioned over said electrical conductor system and having an aperture corresponding to said first predetermined area and aligned therewith, whereby said masking means permits said deposition mixture to be deposited solely within said first predetermined area and prevents said deposition mixture from forming on said electrical conductor system in a second predetermined area outside said first predetermined area.

2. A microelectronic circuit coating system in accordance with claim 1, wherein said masking means comprises a moveable template having an aperture corresponding to said first predetermined area.

3. A microelectronic circuit coating system in accordance with claim 1, wherein said masking device comprises an outer tube having an end section forming an aperture that corresponds to said first predetermined area, said supporting means and said tube being moveable relative to each other.

4. A microelectronic circuit coating system in accordance with claim 3, wherein said mixture directing means comprises an inner tube mounted inside and spaced from said outer tube to form a passage between the tubes and having an end terminating short of said outer tube aperture whereby said chemical deposition mixture is directed through said inner tube onto said first predetermined area and exhaust gases are removed from said first predetermined area through said passage.

5. In combination with the microelectronic circuit system specified in claim 4, a cooling coil secured around said outer tube.

6. A microelectronic circuit coating system in accordance with claim 1, wherein said electrical conductor system is a lead frame.

7. A microelectronic circuit coating system in accordance with claim 1, wherein said system is a circuit board having wires printed thereon.

8. A microelectronic circuit coating system in accordance with claim 1, wherein said elevated temperature is at least 350° C.

9. A microelectronic circuit coating system in accordance with claim 1, wherein said chemical deposition mixture is composed of oxygen, silane, and a carrier gas.

10. A microelectronic circuit coating system in accordance with claim 9, wherein said heating means heats said electrical conductor system to at least 350° C.

11. A microelectronic circuit coating system for simultaneously depositing silicon dioxide on a plurality of discrete dies, each die secured to an electrical conductor system with bonding wires connecting bonding pads on a die to corresponding leads on the electrical conductor system, comprising:
   means for supporting the plurality of electrical conductor system-secured dies, said dies having wires extending from each said die to corresponding leads on the electrical conductor system, each said die and associated extending wires defining a first predetermined area of unconnected segments,
   means for directing a chemical deposition mixture onto said plurality of electrical conductor system-secured dies,
   means for heating said supporting means and said electrical conductor system to an elevated temperature,
   masking means positioned over said electrical conductor system and having an aperture corresponding to said first predetermined area associated with each said die and aligned therewith, whereby said masking means permits said deposition mixture to be deposited solely within said first predetermined area and prevents said deposition mixture from depositing on a second predetermined area outside said first predetermined area of each said die.

12. A microelectronic circuit coating system in accordance with claim 11, wherein said masking means comprises a moveable template having apertures corresponding to each of said first predetermined areas.

13. A microelectronic circuit coating system in accordance with claim 11, wherein said masking means comprises a multiplicity of moveable outer tubes having end sections forming apertures that correspond to the segments of said first predetermined area.

14. A microelectronic circuit coating system in accordance with claim 13, wherein said mixture directing means comprises an inner tube mounted inside and spaced from each said outer tube to form a passage between the tubes and having an end terminating short of each said outer tube aperture whereby said mixture of oxygen, and a carrier gas is directed through said inner tube onto each segment of said first predetermined area and exhaust gases are removed from each segment of said first predetermined area through said passage.

15. In combination with the microelectronic circuit system specified in claim 14, a cooling coil secured around each said outer tube.

16. A microelectronic circuit coating system in accordance with claim 11, wherein said electrical conductor system is a lead frame.

17. A microelectronic circuit coating system in accordance with claim 11, wherein said system is a circuit board having wires printed thereon.

18. A microelectronic circuit coating system in accordance with claim 11, wherein said elevated temperature is at least 350° C.

19. A microelectronic circuit coating system in accordance with claim 11, wherein said chemical deposition mixture is composed of oxygen, silane, and a carrier gas.

20. A microelectronic circuit coating system in accordance with claim 19, wherein said heating means heats said electrical conductor system to at least 350° C.

* * * * *